United States Patent
Iwasawa

(10) Patent No.: US 8,547,458 B2
(45) Date of Patent: Oct. 1, 2013

(54) SOLID-STATE IMAGE PICKUP DEVICE

(75) Inventor: Takahiro Iwasawa, Kyoto (JP)

(73) Assignee: Rosnes Corporation, Kyoto-shi (JP)

( * ) Notice: Subject to any disclaimer, the term of this patent is extended or adjusted under 35 U.S.C. 154(b) by 127 days.

(21) Appl. No.: 13/146,293

(22) PCT Filed: Feb. 2, 2010

(86) PCT No.: PCT/JP2010/051384
§ 371 (c)(1),
(2), (4) Date: Jul. 26, 2011

(87) PCT Pub. No.: WO2010/090167
PCT Pub. Date: Aug. 12, 2010

(65) Prior Publication Data
US 2012/0018787 A1    Jan. 26, 2012

(30) Foreign Application Priority Data
Feb. 4, 2009  (JP) .................................. 2009-023513

(51) Int. Cl.
*H04N 3/14* (2006.01)
*H04N 5/335* (2011.01)
*H04N 9/04* (2006.01)

(52) U.S. Cl.
USPC ............ 348/272; 348/275; 348/294; 348/298

(58) Field of Classification Search
USPC .............. 348/272, 275, 294–324; 250/208.1; 257/290–292
See application file for complete search history.

(56) References Cited

U.S. PATENT DOCUMENTS

| | | | |
|---|---|---|---|
| 5,119,181 A | 6/1992 | Perregaux et al. | |
| 6,184,929 B1 | 2/2001 | Noda et al. | |
| 6,646,682 B1 | 11/2003 | Hou | |
| 6,956,605 B1 | 10/2005 | Hashimoto | |
| 7,704,781 B2 | 4/2010 | McKee | |
| 7,728,895 B2 | 6/2010 | Tanaka et al. | |
| 7,825,970 B2 | 11/2010 | Choi et al. | |
| 8,208,054 B2 * | 6/2012 | Yamaguchi et al. | 348/300 |
| 8,314,866 B2 | 11/2012 | Massetti | |
| 2004/0100570 A1 | 5/2004 | Shizukuishi | |
| 2006/0038904 A1 | 2/2006 | Kudoh | |

(Continued)

FOREIGN PATENT DOCUMENTS

| | | |
|---|---|---|
| JP | 2004-253740 A | 9/2004 |
| JP | 2005-198001 | 7/2005 |

(Continued)

*Primary Examiner* — Yogesh Aggarwal
(74) *Attorney, Agent, or Firm* — Marvin A. Motsenbocker; Mots Law, PLLC

(57) ABSTRACT

A solid-state image pickup device includes a pixel array having a plurality of photodiodes that are disposed in a matrix, electric charge transfer gates, and a floating diffusion (FD), and further includes a reset transistor and an amplifier transistor each shared by the four adjacent photodiodes. In the solid-state image pickup device, the photodiodes include first to fourth photodiodes. In a state where the amplifier transistor is activated, electric charge transfer gates connected respectively to the first to fourth photodiodes are sequentially turned ON and electric charges accumulated in the photodiodes are sequentially read out through the FD. Accordingly, a readout blanking period can be minimized to and signal charges can be read out at high speed. Moreover, readout signal lines need only to be provided for every two columns of the photodiodes, so that openings of the photodiodes can be increased in size.

6 Claims, 11 Drawing Sheets

(56) References Cited

U.S. PATENT DOCUMENTS

| | | | |
|---|---|---|---|
| 2006/0071148 A1* | 4/2006 | Bock | 250/208.1 |
| 2006/0119715 A1 | 6/2006 | Nam | |
| 2006/0231739 A1 | 10/2006 | Sekine et al. | |
| 2008/0088724 A1 | 4/2008 | Kudoh | |
| 2009/0090845 A1 | 4/2009 | Yin et al. | |
| 2009/0295954 A1 | 12/2009 | Mori et al. | |
| 2009/0321800 A1 | 12/2009 | Ohkawa | |
| 2010/0110237 A1 | 5/2010 | Hashimoto et al. | |
| 2010/0157116 A1 | 6/2010 | Kikuchi | |
| 2011/0249156 A1 | 10/2011 | Goto | |

FOREIGN PATENT DOCUMENTS

| | | |
|---|---|---|
| JP | 2010-10370 A | 1/2010 |
| JP | 2010-212288 A | 9/2010 |
| JP | 2010-216819 A | 9/2010 |
| WO | WO 2008/133146 A1 | 11/2008 |

* cited by examiner

SOLID-STATE IMAGE PICKUP DEVICE

TECHNICAL FIELD

The present invention relates to a solid-state image pickup device, and particularly relates to a solid-state image pickup device in which an amplifier transistor and a reset transistor are shared by a plurality of pixels.

BACKGROUND ART

There have been widely used video cameras and electronic cameras in recent years. These cameras include solid-state image sensors such as CCDs (Charge Coupled Devices) or CMOS (Complementary Metal Oxide Semiconductor) image sensors. Such solid-state image sensors each include an imaging block in which a plurality of photoelectric conversion blocks each configured by a photodiode are disposed in a two-dimensional array, and there are formed unit regions (unit pixels) each including the photodiode as a main functional part.

In such a CCD, a light beam incident on each unit pixel is photoelectrically converted by a photodiode into a signal charge, which is transferred to a floating diffusion (FD) block provided at an output block through a vertical CCD transfer register as well as through a horizontal CCD transfer register. Thereafter, in the CCD, a MOS transistor detects a variation in electric potential of the FD block, and the detected variation in electric potential is amplified and outputted as an imaging signal.

To the contrary, a CMOS image sensor includes in each unit pixel an FD block as well as various types of MOS transistors used for transfer, amplification, and the like, and accordingly does not need to transfer an electric charge. The CMOS image sensor is thus operable at a lower voltage in comparison to a CCD-type solid-state image sensor, and is suited to reduce the electric power consumption. The CMOS image sensor is also suited to reduce the size of the image sensor since complicated signal processing functions can be easily integrated in one chip. There have been many conventionally used CMOS image sensors in each of which a MOS transistor having the amplification function is disposed in each pixel and three transistors are included in one pixel cell due to the miniaturization thereof.

For the purpose of further miniaturization, there is adopted a configuration in which a plurality of pixels share a reset transistor and an amplifier transistor, although the reset transistor and the amplifier transistor have been conventionally provided for each pixel.

FIG. 9 shows a CMOS image sensor having a configuration in which a reset transistor and an amplifier transistor are shared by four pixels. A pixel array 916 includes four photodiodes 902, 904, 906, and 908 as well as four electric charge transfer gates 903, 905, 907, and 909 respectively disposed as illustrated in a shared pixel 901, so as to share a reset transistor 910 and an amplifier transistor 911.

FIG. 10 is a diagram showing the configuration of a shared pixel array. In this array, a pixel cell 1001 corresponds to the photodiode 902. Similarly, pixel cells 1002, 1003, and 1004 correspond to the photodiodes 904, 906, and 908, respectively (see Patent Document 1, for example).

Upon receiving light beams, signal charges (electrons) accumulated in the photodiode 102 are transferred to a floating diffusion (FD) block through the electric charge transfer gate 903 in accordance with readout pulses that are applied from a readout signal line Tx01 to a gate electrode of the electric charge transfer gate 903.

The FD block is connected to a gate electrode of the amplifier transistor 911, and a variation in electric potential of the FD block caused by the signal charges (electrons) is impedance-converted by the amplifier transistor 911 and is then outputted to a vertical signal line.

Readout circuits 913 are connected to a horizontal shift register 914 so as to be selected for each pixel clock and obtain a image output from a signal output "readout". Thereafter, the reset transistor 910 resets the electric potential of the FD block so as to be equal to the electric potential of a power supply line PV in accordance with a vertical reset pulse that is applied from a vertical reset line Rx0 to a gate electrode thereof.

A vertical shift register 915 reads out signals of the photodiodes from the signal output "readout" while sequentially activating the readout signal lines Tx and the vertical reset lines Rx.

Further, a readout circuit block performs CDS operations with use of noise memories and signal memories respectively provided for columns, thereby achieving removal of FPN noise and kTC noise generated in a pixel block.

This configuration realizes a MOS solid-state image pickup device of high sensibility and low noise, and it is becoming possible to achieve digital still cameras to have image quality properties better than those of a digital still camera including a CCD.

Furthermore, increase in the number of pixels reduces the area for one pixel in a digital still camera, so that micromachining techniques are essentially required. Patent Document 1 describes in detail a circuit design having a configuration in which a reset transistor and an amplifier MOS transistor are shared by four pixels to increase an opening space of each photodiode.

PRIOR ART DOCUMENT

Patent Document

Patent Document 1: Japanese Unexamined Patent Publication No. 2005-198001

SUMMARY OF THE INVENTION

Problems to be Solved by the Invention

As described above, a conventional solid-state image pickup device requires three MOS transistors for one pixel in order to achieve imaging at a high S/N ratio, which is obviously disadvantageous in the miniaturization of each pixel cell. Although the development in the micromachining techniques in the semiconductor manufacturing process realizes reduction in size of pixels to some extent in a CMOS image sensor, there arise problems such as decrease in dynamic range due to reduction in voltage of a power supply and increase in 1/f noise due to the miniaturization of the amplifier transistor.

Accordingly, a high dynamic range and a high S/N ratio can be effectively achieved by the reduction in the number of transistors themselves rather than the miniaturization of the transistors. In this regard, in the conventional solid-state image pickup device, four photoelectric image sensors are connected to one floating diffusion and an amplifier MOS transistor is shared, so as to reduce the number of transistors for one pixel.

However, along with the further development in the micromachining techniques in the semiconductor manufacturing process, the pixel cell is more miniaturized and the number of pixels in a digital still camera is further increased. Under these conditions, what should be achieved are the reduction in the number of interconnections per unit pixel as well as the sharing of transistors.

In the case of adopting such a configuration in which transistors are shared to reduce the number of transistors for one pixel and the interconnections are also shared, there arises another technical requirement for securely achieving a fast signal output that is compatible with a conventional CMOS image sensor and is therefore easily operable.

Furthermore, although there have been made various proposals for the sharing of transistors, no consideration has been made on the timing of driving operation that is compatible with such a conventional CMOS image sensor.

Solutions to the Problems

The present invention provides as first means a solid-state image pickup device including on a semiconductor substrate: a pixel array including a plurality of photodiodes that are disposed in a matrix (i, j) to convert light beams into signal charges and accumulate the signal charges; electric charge transfer gates each for reading out the signal charges accumulated in the corresponding photodiode; a floating diffusion for converting into electric potentials the signal charges that are photoelectrically converted by the photodiodes and are read out through the electric charge transfer gates; a reset transistor for resetting the signal charges; and an amplifier transistor for amplifying the read out signal charges, the reset transistor and the amplifier transistor being shared by the four adjacent photodiodes, and the photodiodes including a first photodiode (i, j), a second photodiode (i, j+1), a third photodiode (i+1, j+n), and a fourth photodiode (i+n, j+n+1) being disposed respectively, in which n is equal to −1 or +1, wherein in a state where the amplifier transistor is activated, the electric charge transfer gates connected respectively to the first, second, third, and fourth photodiodes are sequentially turned ON and the electric charges accumulated in the photodiodes are sequentially read out through the floating diffusion.

The present invention provides as second means a solid-state image pickup device including on a semiconductor substrate: a pixel array including a plurality of photodiodes that are disposed in a matrix (i, j) to convert light beams into signal charges and accumulate the signal charges; readout circuits provided above and below the pixel array; electric charge transfer gates each for reading out the signal charges accumulated in the corresponding photodiode; a floating diffusion for converting into electric potentials the signal charges that are photoelectrically converted by the photodiodes and are read out through the electric charge transfer gates; a reset transistor for resetting the signal charges; and an amplifier transistor for amplifying the read out signal charges, the reset transistor and the amplifier transistor being shared by the four adjacent photodiodes, and the photodiodes including a first photodiode (i, j), a second photodiode (i, j+1), a third photodiode (i+1, j+n), and a fourth photodiode (i+n, j+n+1) being disposed respectively, in which n is equal to −1 or +1, wherein the signal charges are read out from the first and third photodiodes by one of the readout circuits above and below the pixel array, and the signal charges are read out from the second and fourth photodiodes by the readout circuit that is not used to read out the signal charges from the first and third photodiodes.

Further, signals are read out from two of the first to fourth photodiodes in an identical readout blanking period, the two photodiodes of which the signals are read out in the identical blanking period are the first and second photodiodes, and the remaining two photodiodes of which the signals are read out in a subsequent blanking period are the third and fourth photodiodes.

The present invention provides as third means a solid-state image pickup device including on a semiconductor substrate: a pixel array including a plurality of photodiodes that are disposed in a matrix (i, j) to convert light beams into signal charges and accumulate the signal charges; readout circuits provided above and below the pixel array; electric charge transfer gates each for reading out the signal charges accumulated in the corresponding photodiode; a floating diffusion for converting into electric potentials the signal charges that are photoelectrically converted by the photodiodes and are read out through the electric charge transfer gates; a reset transistor for resetting the signal charges; and an amplifier transistor for amplifying the read out signal charges, the reset transistor and the amplifier transistor being shared by the four adjacent photodiodes, and the photodiodes including a first photodiode (i, j), a second photodiode (i, j+1), a third photodiode (i+1, j+n), and a fourth photodiode (i+n, j+n+1) being disposed respectively, in which n is equal to −1 or +1, wherein when n is equal to +1, the photodiodes include a fifth photodiode (i+1, j) adjacent to the first photodiode and a sixth photodiode (i, j+2) adjacent to the fourth photodiode, and the signal charges are read out from a combination of the first and fifth photodiodes or a combination of the fourth and sixth photodiodes in an identical readout blanking period.

Furthermore, when n is equal to −1, the photodiodes include a seventh photodiode (i+1, j+1) adjacent to the second photodiode and an eighth photodiode (i, j−1) adjacent to the third photodiode, and the signal charges are read out from a combination of the second and seventh photodiodes or a combination of the eighth and third photodiodes in an identical readout blanking period.

Moreover, when the signal charges are sequentially read out from one of the first to fourth photodiodes and one of the fifth to eighth photodiodes in an identical readout blanking period, between an operation of firstly reading out the signal charge from the corresponding photodiode and an operation of secondly reading out the signal charge from the corresponding photodiode, the floating diffusion shared by the photodiode subjected to the first readout operation and the photodiode subjected to the second readout operation is changed from a selected state to a deselected state.

Effects of the Invention

By the first means of the present invention, in the state of activating the pixel cell that includes the first to fourth photodiodes, the electric charge transfer gates respectively connected to the photodiodes, and the reset transistor as well as the amplifier transistor each being shared, it is possible to sequentially read out the electric charges of the first to fourth photodiodes, so as to minimize the readout blanking periods and read out the signal charges at high speed.

Further, only one readout signal line is required for the photodiodes in two columns, which realizes increase of the opening spaces of the photodiodes.

By the second means of the present invention, out of the first to fourth photodiodes, signals of two pixels are read out once by the readout circuits that are disposed above and below the pixel array. In this configuration, although there are provided the plurality of upper and lower readout circuits, the signals of the photodiodes in an identical color can always be read out from either one of the upper and lower readout circuits. Prevented therefore is deterioration in image due to varied gains by the readout circuits or the like, and it is possible to obtain an excellent image.

By the third means of the present invention, signals can be outputted in the raster scanning method that is compatible with a conventional CMOS image sensor. Therefore, it is possible to replace the conventional CMOS image sensor with a CMOS image sensor of high performance with no change being made to the peripheral circuits.

The present invention achieves the developments in the micromachining techniques in the semiconductor manufacturing process as well as the miniaturization of the MOS solid-state image pickup device. Therefore, it is possible to provide the solid-state image pickup device that is small in size but has a large number of pixels, which therefore realizes generation of excellent images having less noise.

The solid-state image pickup device according to the present invention is compatible with a conventional system. Therefore, it is possible to replace the conventional system with a CMOS image sensor of high performance with no change being made in the peripheral designs.

Further, the image quality of photographed images can be improved in video cameras, digital cameras, mobile terminal devices, mobile phones with cameras, and the like, which each adopt the solid-state image pickup device according to the present invention.

The solid-state image pickup device according to the present invention also achieves reduction in size of the device, reduction in cost, as well as reduction in electric power consumption. Therefore, the solid-state image pickup device of the present invention is particularly suitable for small digital still cameras, cameras installed in mobile phones, and the like.

Figure 1A:
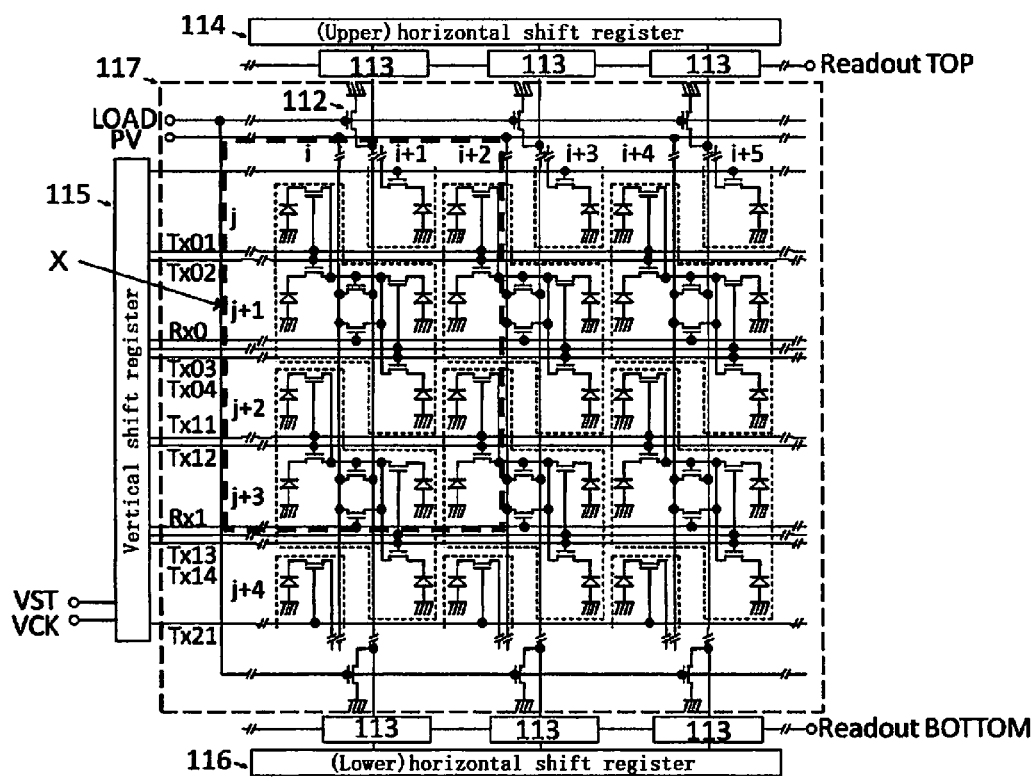
FIG. 1A is a diagram showing the configuration of a CMOS image sensor according to the present invention.

DESCRIPTION OF SYMBOLS 101 shared first pixel cell in the present invention
102 first photodiode in the present invention
103 electric charge transfer gate for first photodiode in the present invention
104 second photodiode in the present invention
105 electric charge transfer gate for second photodiode in the present invention
106 third photodiode in the present invention
107 electric charge transfer gate for third photodiode in the present invention
108 fourth photodiode in the present invention
109 electric charge transfer gate for fourth photodiode in the present invention
110 reset transistor in the present invention
111 amplifier transistor in the present invention
112 load transistor in the present invention
113 readout circuit in the present invention
114 (upper) horizontal shift register in the present invention
115 vertical shift register in the present invention
116 (lower) horizontal shift register in the present invention
117 pixel array in the present invention
118 shared second pixel cell in the present invention
201 first pixel cell in the present invention
202 second pixel cell in the present invention
203 third pixel cell in the present invention
204 fourth pixel cell in the present invention
205 drive signal line for electric charge transfer gate in first pixel cell in the present invention
206 drive signal line for electric charge transfer gate in second pixel cell in the present invention
207 drive signal line for electric charge transfer gate in third pixel cell in the present invention
208 drive signal line for electric charge transfer gate in fourth pixel cell in the present invention
209 reset signal line for shared pixel cells in the present invention
210 FD region of shared pixel cells in the present invention
211 power supply line for shared pixel cells in the present invention
212 signal output line for shared pixel cells in the present invention
213 bias line of load transistor for amplifier transistor in the present invention
301 fifth photodiode in a third embodiment of the present invention
302 sixth photodiode in the third embodiment of the present invention
401 seventh photodiode in the third embodiment of the present invention
402 eighth photodiode in the third embodiment of the present invention
901 shared pixel cell in the conventional art
902 first photodiode in the conventional art
903 electric charge transfer gate for first photodiode in the conventional art
904 second photodiode in the conventional art
905 electric charge transfer gate for second photodiode in the conventional art
906 third photodiode in the conventional art
907 electric charge transfer gate for third photodiode in the conventional art
908 fourth photodiode in the conventional art
909 electric charge transfer gate for fourth photodiode in the conventional art
910 reset transistor in the conventional art
911 amplifier transistor in the conventional art
912 load transistor in the conventional art
913 readout circuit in the conventional art
914 horizontal shift register in the conventional art 915 vertical shift register in the conventional art
916 pixel array in the conventional art

MODES FOR CARRYING OUT THE INVENTION

There is provided a solid-state image pickup device that drives, at high speed in a manner compatible with a conventional CMOS image sensor, a pixel cell in which transistors and interconnections are shared to realize miniaturization of the pixel cell. Described below are embodiments of the present invention with reference to the accompanying drawings.

First Embodiment

Figure 1B:
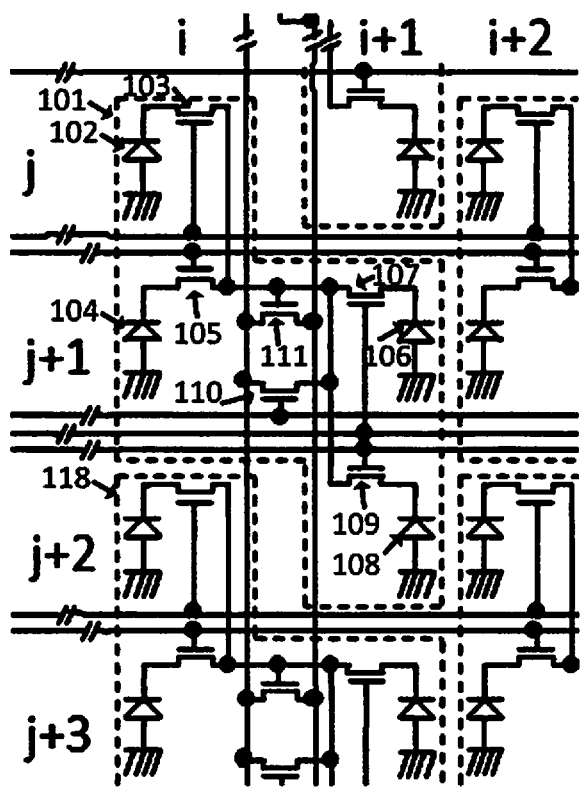
FIG. 1B is an enlarged diagram showing a portion (an X region) of FIG. 1A.

FIG. 1A is a diagram best indicating the features of the present invention and showing the configuration of a CMOS image sensor in which reset transistors and amplifier transistors are shared and pixel cells are disposed in an array. FIG. 1B is an enlarged diagram showing a portion (an X region) of FIG. 1A.

A pixel cell 101 includes first to fourth photodiodes 102, 104, 106, and 108, electric charge transfer gates 103, 105, 107, and 109 each for transferring electric charges from the corresponding photodiode, an FD block, a reset transistor 110 for resetting the FD block, and an amplifier transistor 111 for amplifying signals from the FD block and outputting the amplified signals.

The photodiodes are disposed in a matrix (i, j) to configure a pixel array 117. Gates of the electric charge transfer gates 103, 105, 107, and 109 are connected to a vertical shift register through readout signal lines Tx01 to Tx04, respectively. The reset transistor 110 has a gate connected to a vertical reset line drawn out of the vertical shift register.

The amplifier transistors 111 have output terminals provided as readout signal lines that are aligned in the column direction. The output terminals of the amplifier transistors in an identical column are connected with each other so as to be shared. There are disposed and connected above and below the pixel array 117 transistors 112 for applying loads to the amplifier transistors.

There are readout circuits 113 disposed and connected on the readout signal lines above and below the pixel array 117. Each of the readout circuits 113 is configured by a sample and hold circuit for removing noise, a transistor circuit for selecting a horizontal pixel, and the like.

Each of the readout circuits 113 is connected to a horizontal shift register 114 or 116 and signals are outputted respectively from the pixels. The readout circuits 113 are provided above and below the pixel array 117, and are respectively disposed thereabove or therebelow for every two columns of photodiodes. Similarly, the readout signal lines drawn out of the amplifier transistors 111 are respectively provided for the every two columns of photodiodes.

FIGS. 1A and 1B described above are diagrams each showing the configuration of the CMOS image sensor according to the present invention.

Figure 2:
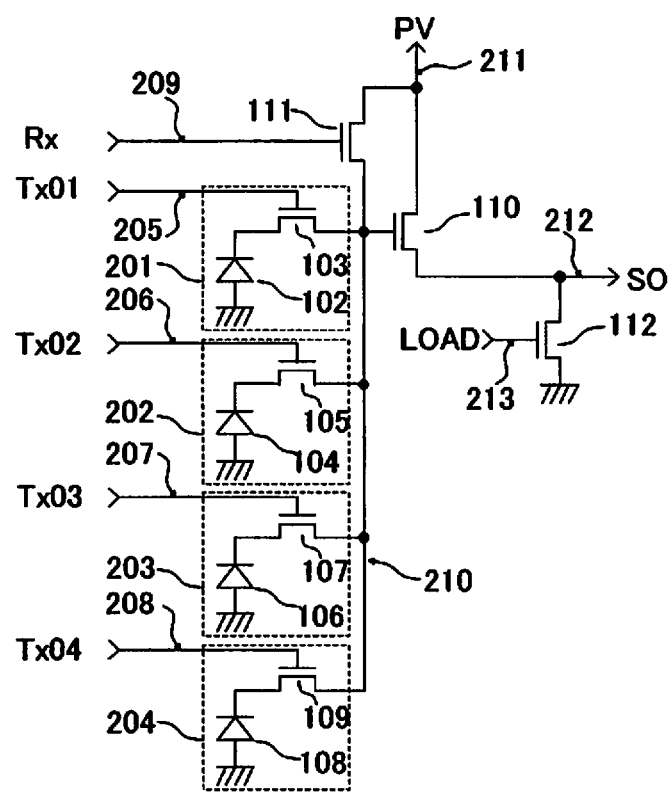
FIG. 2 is a diagram showing the configuration of a shared pixel cell according to the present invention.

The pixel cell 101 includes the four photodiodes and the four electric charge transfer gates, as well as the shared FD block, the shared reset transistor, and the shared amplifier transistor. FIG. 2 is a diagram showing the configuration of the pixel cell.

Although not illustrated as a circuit in the pixel cell configuration diagram in FIG. 2, the FD block is provided on a line 210 that is connected to the electric charge transfer gates.

The load transistor 112 illustrated in FIG. 2 is similar to the load transistors 112 illustrated in FIG. 1A in which the load transistors 112 are disposed above and below the pixel array 117. While FIG. 1A is the configuration diagram showing the arrangement in which the symmetry is kept in the CMOS image sensor, the load transistors 112 may be alternatively disposed only above or below the pixel array.

Figure 5:
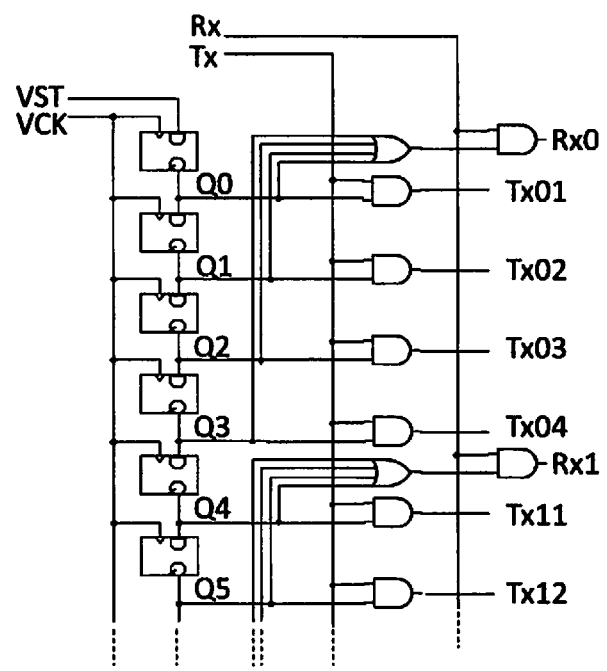
FIG. 5 is a diagram exemplarily showing a vertical shift register according to a first embodiment of the present invention.

A vertical shift register 115 has a circuit configuration exemplified in FIG. 5. The vertical shift register shown in FIG. 5 is driven by a vertical shift register clock VCK and a vertical shift register start pulse VST, and operates as shown in a timing chart shown in FIG. 6.

Assume that the readout signal lines Tx01, Tx02, Tx03, and Tx04 as well as a vertical reset line Rx0 shown in FIG. 5 are connected to the readout signal lines Tx01, Tx02, Tx03, and Tx04 as well as a vertical reset line Rx0 shown in FIG. 1A. Further, it is assumed that readout signal lines Tx11, Tx12, Tx13 (not shown), and a readout signal line Tx14 (not shown) as well as a vertical reset line Rx1 shown in FIG. 5 are connected to readout signal lines Tx11, Tx12, Tx13, and Tx14 as well as a vertical reset line Rx1 shown in FIG. 1A.

The readout signal lines Tx01, Tx02, Tx03, and Tx04 as well as the vertical reset line Rx0 drive the first pixel cell 101, while the readout signal lines Tx11, Tx12, Tx13, and Tx14 as well as the vertical reset line Rx1 drive a second pixel cell 118.

Figure 6:
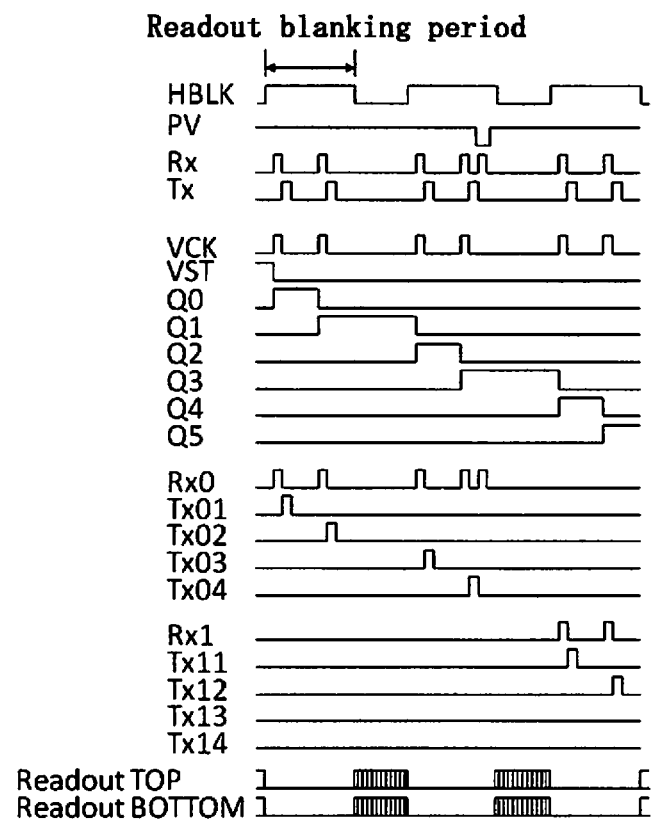
FIG. 6 is a timing chart of driving operations according to the first embodiment of the present invention.

The vertical shift register 115 generates driving pulses shown in FIG. 6 in order to operate the first pixel cell 101 and the second pixel cell 118.

The FD block in the first pixel cell 101 is initially activated and a pixel signal is read out through the amplifier transistor. The pixel signal turns ON the vertical reset line Rx0 to connect a power supply line PV and the FD block, which is reset in this state.

The readout signal line Tx01 is then turned ON so as to turn ON the electric charge transfer gate. A signal charge is read out from the first photodiode 102 and is transmitted to the FD block having been reset, and is then read out by the corresponding readout circuit 113 that is disposed above or below the pixel array 117 through the amplifier transistor.

Thereafter, the vertical reset line Rx0 is turned ON so as to reset the FD block. The readout signal line Tx02 is turned ON and a signal charge is read out from the second photodiode 104. These operations are repeated to read out signals from the third photodiode and the fourth photodiode, respectively.

After the signals are read out from the first to fourth photodiodes that are shared in the first pixel cell 101, the power supply line PV is set to an L level and the vertical reset line Rx0 is turned ON so as to deselect the FD block that is disposed in the first pixel cell 101.

Subsequently, in order to read out signals from the second pixel cell 118, the readout signal lines Tx11, Tx12, Tx13, and Tx14 as well as the vertical reset line Rx1 activate the FD block similarly to the case of the first pixel cell 101 described above. Then, signals are sequentially read out from the four shared photodiodes. The FD block is thereafter deselected by the power supply line PV and the vertical reset line Rx1.

As described above, signals can be read out from the four photodiodes by performing the deselecting operation by the power supply line PV once for each pixel cell. These readout operations require the deselecting operation once for every four pixels, which enables the scanning operations by the vertical shift register at high speed.

Second Embodiment

Described next is the second embodiment according to the present invention.

FIG. 1A is a diagram best indicating the features of the present invention and showing the configuration of a CMOS image sensor in which reset transistors and amplifier transistors are shared and pixel cells are disposed in an array. FIG. 1B is an enlarged diagram showing a portion (an X region) of FIG. 1A.

A pixel cell 101 includes first to fourth photodiodes 102, 104, 106, and 108, electric charge transfer gates 103, 105, 107, and 109 each for transferring electric charges from the corresponding photodiode, an FD block, a reset transistor 110 for resetting the FD block, and an amplifier transistor 111 for amplifying signals from the FD block and outputting the amplified signals.

The photodiodes are disposed in a matrix (i, j) to configure a pixel array 117. Gates of the electric charge transfer gates 103, 105, 107, and 109 are connected to a vertical shift register through readout signal lines Tx01 to Tx04, respectively. The reset transistor 110 has a gate connected to a vertical reset line drawn out of the vertical shift register.

The amplifier transistors 111 have output terminals provided as readout signal lines that are aligned in the column direction. The output terminals of the amplifier transistors in an identical column are connected with each other so as to be shared. There are disposed and connected above and below the pixel array 117 transistors 112 for applying loads to the amplifier transistors.

There are readout circuits 113 disposed and connected on the readout signal lines above and below the pixel array 117. Each of the readout circuits 113 is configured by a sample and hold circuit for removing noise, a transistor circuit for selecting a horizontal pixel, and the like.

Each of the readout circuits 113 is connected to a horizontal shift register 114 or 116 and signals are outputted respectively from the pixels. The readout circuits 113 are provided above and below the pixel array 117, and are respectively disposed thereabove or therebelow for every two columns of photodiodes. Similarly, the readout signal lines drawn out of the amplifier transistors 111 are respectively provided for the every two columns of photodiodes.

FIGS. 1A and 1B described above are diagrams each showing the configuration of the CMOS image sensor according to the present invention.

The CMOS image sensor includes color filters that are disposed on the photodiodes in order to obtain color images. The color filters are in primary colors of R (red), G (green), and B (blue) or in complementary colors of Cy (cyan), Ye (yellow), and G (green), and Mg (magenta).

The color filters G are disposed so as to form a checkered pattern in any one of the case of arranging the color filters in the primary colors and the case of arranging the color filters in the complementary colors. In four diagonal positions with respect to a photodiode having the G color filter, there are disposed G filters in the identical color.

In a case where the G color filter is disposed on the first photodiode in the first pixel cell 101, the third photodiode will be provided thereon with a G color filter. In another case where the G color filter is disposed on the second photodiode, the fourth photodiode will be provided thereon with a G color filter.

As in the readout timings indicated in FIG. 6, signals of two photodiodes will be read out in one readout blanking period. In this case, signals of the first and second photodiodes are read out in one readout blanking period.

In a case where the signal read out from the first photodiode is transmitted to the corresponding readout circuit 113 disposed above the pixel array 117, the signal read out from the second photodiode is transmitted to the corresponding readout circuit 113 disposed below the pixel array 117. Alternatively, in another case where the signal read out from the first photodiode is transmitted to the corresponding readout circuit 113 disposed below the pixel array 117, the signal read out from the second photodiode is transmitted to the corresponding readout circuit 113 disposed above the pixel array 117.

Read out in a subsequent readout blanking period are signals of the third and fourth photodiodes that are shared in the first pixel cell 101. In this case, the signal read out from the third photodiode is transmitted to the readout circuit 113 that received the signal from the first photodiode. The signal read out from the remaining fourth photodiode is transmitted to the readout circuit 113 that received the signal from the second photodiode.

In this manner, the readout operations are performed such that the signals from the first and third photodiodes are transmitted through the identical readout circuit 113 disposed above or below. Further, the readout operations are performed such that the signals from the second and fourth photodiodes are transmitted through the identical readout circuit 113 not used for reading out the signals from the first and third photodiodes.

The readout operations described above allow the G signals to be transmitted through only the readout circuit 113 disposed above or below. Such use of the identical readout circuit 113 suppresses variation in property generated upon the readout operations.

In a case where there is generated variation in property between the G signals, noise in a horizontal stripe is generally caused in an image. However, signals transmitted through the identical readout circuit achieve the symmetry in property.

It is possible to form a symmetrical layout configuration with use of the photodiodes that are shared in the configuration of the pixel cell as in the present invention and are provided with the G color filters. As a result, it is possible to achieve the optically symmetrical properties.

Third Embodiment

Described next is the third embodiment of the present invention.

FIG. 1A is a diagram best indicating the features of the present invention and showing the configuration of a CMOS image sensor in which reset transistors and amplifier transistors are shared and pixel cells are disposed in an array. FIG. 1B is an enlarged diagram showing a portion (an X region) of FIG. 1A.

A pixel cell 101 includes first to fourth photodiodes 102, 104, 106, and 108, electric charge transfer gates 103, 105, 107, and 109 each for transferring electric charges from the corresponding photodiode, an FD block, a reset transistor 110 for resetting the FD block, and an amplifier transistor 111 for amplifying signals from the FD block and outputting the amplified signals.

The photodiodes are disposed in a matrix (i, j) to configure a pixel array 117. Gates of the electric charge transfer gates 103, 105, 107, and 109 are connected to a vertical shift register through readout signal lines Tx01 to Tx04, respectively. The reset transistor 110 has a gate connected to a vertical reset line drawn out of the vertical shift register.

The amplifier transistors 111 have output terminals provided as readout signal lines that are aligned in the column direction. The output terminals of the amplifier transistors in an identical column are connected with each other so as to be shared. There are disposed and connected above and below the pixel array 117 transistors 112 for applying loads to the amplifier transistors.

There are readout circuits 113 disposed and connected on the readout signal lines above and below the pixel array 117. Each of the readout circuits 113 is configured by a sample and hold circuit for removing noise, a transistor circuit for selecting a horizontal pixel, and the like.

Each of the readout circuits 113 is connected to a horizontal shift register 114 or 116 and signals are outputted respectively from the pixels. The readout circuits 113 are provided above and below the pixel array 117, and are respectively disposed thereabove or therebelow for every two columns of photodiodes. Similarly, the readout signal lines drawn out of the amplifier transistors 111 are respectively provided for the every two columns of photodiodes.

Figure 7:
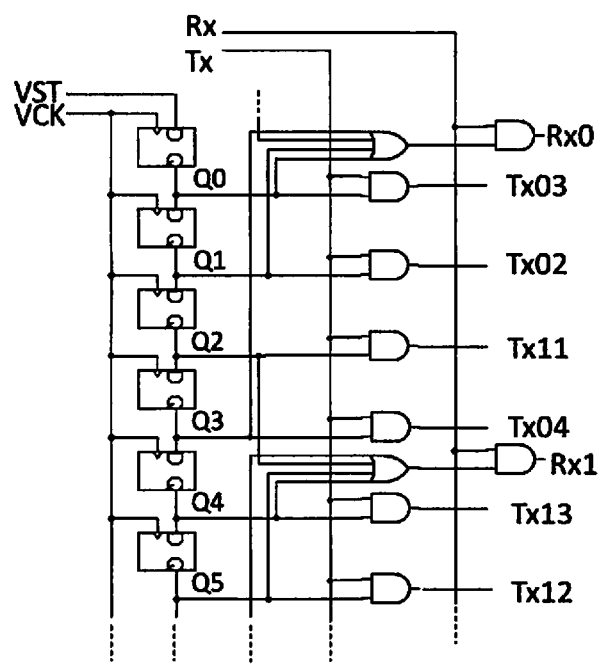
FIG. 7 is a diagram exemplarily showing a vertical shift register according to a third embodiment of the present invention.

FIG. 7 shows an exemplary vertical shift register 115 according to the third embodiment of the present invention. Assume that the readout signal lines Tx01 (not shown), Tx02, Tx03, and Tx04 as well as a vertical reset line Rx0 shown in FIG. 7 are connected to the readout signal lines Tx01, Tx02, Tx03, and Tx04 as well as a vertical reset line Rx0 shown in FIG. 1A. Further, it is assumed that readout signal lines Tx11, Tx12, Tx13, and Tx14 (not shown) as well as a vertical reset line Rx1 shown in FIG. 7 are connected to readout signal lines Tx11, Tx12, Tx13, and Tx14 as well as a vertical reset line Rx1 shown in FIG. 1A.

The readout signal lines Tx01, Tx02, Tx03, and Tx04 as well as the vertical reset line Rx0 drive the first pixel cell 101, while the readout signal lines Tx11, Tx12, Tx13, and Tx14 as well as the vertical reset line Rx1 drive a second pixel cell 118.

Figure 8:
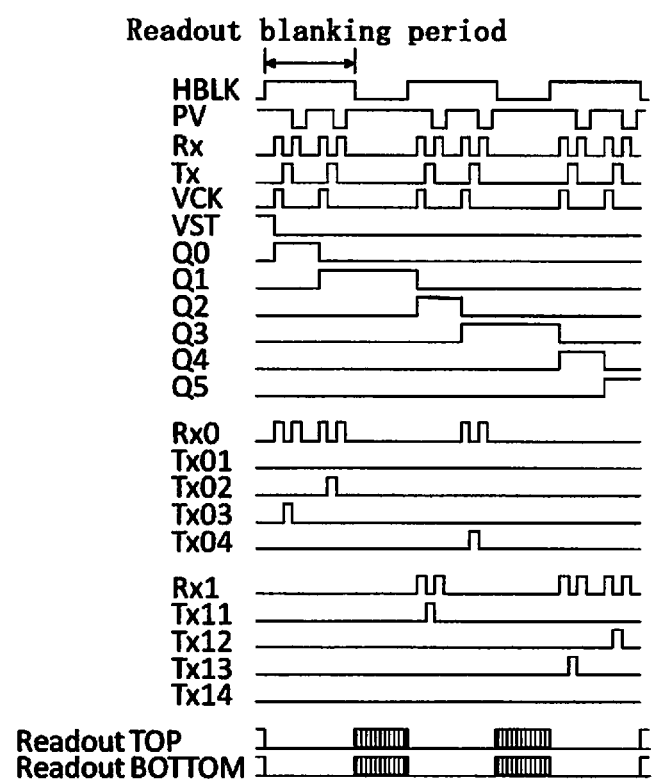
FIG. 8 is a timing chart of driving operations according to the third embodiment of the present invention.
Figure 9:
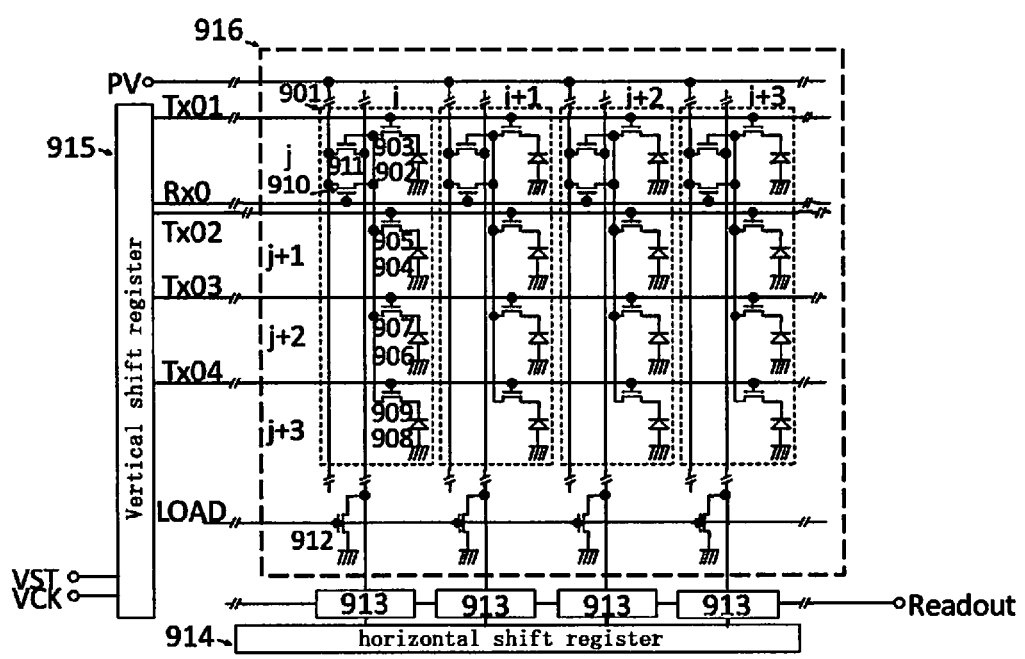
FIG. 9 is a diagram showing the configuration of a conventional CMOS image sensor.
Figure 10:
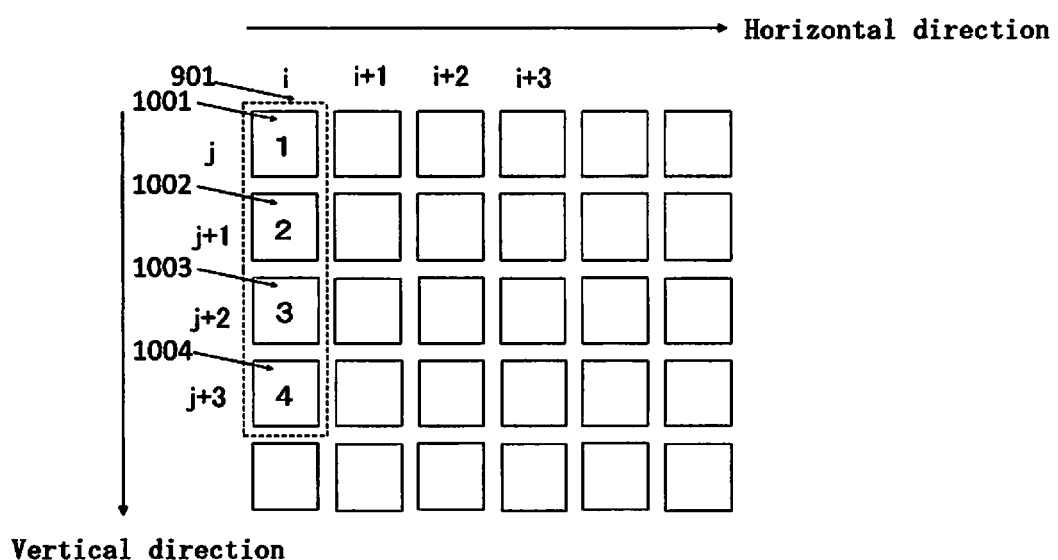
FIG. 10 is a diagram showing the arrangement of shared pixel cells in the conventional art.

The vertical shift register 115 generates driving pulses shown in FIG. 8 in order to operate the first pixel cell 101 and the second pixel cell 118.

Figure 3:
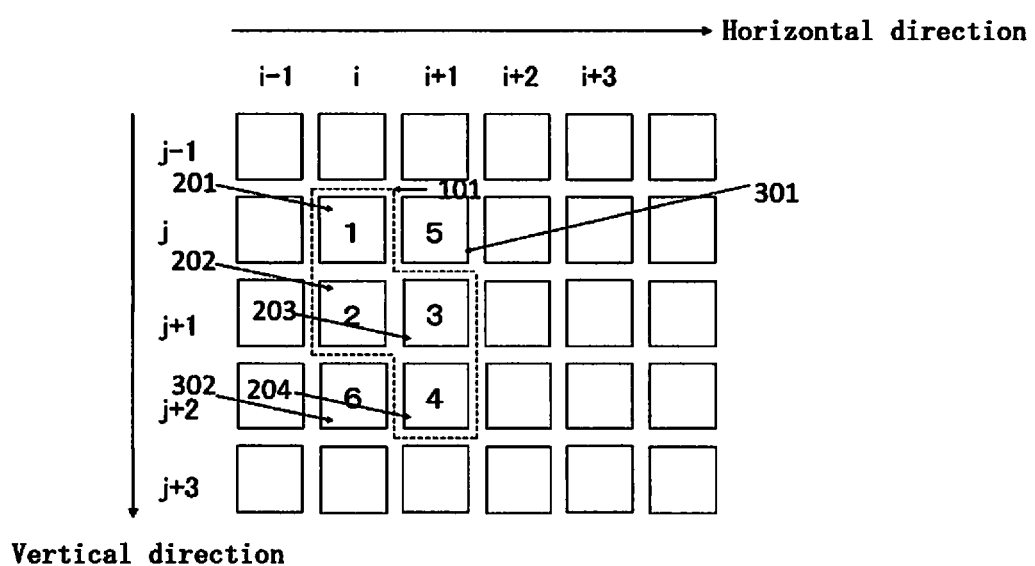
FIG. 3 is a diagram showing the arrangement in a shared pixel cell according to the present invention (when n is equal to +1).

FIG. 3 is a diagram showing the arrangement in a shared pixel cell according to third means of the present invention, in a case where n is equal to +1, in which a fifth photodiode is disposed to the immediate right of the first photodiode, and a sixth photodiode is disposed to the immediate left of the fourth photodiode.

Figure 4:
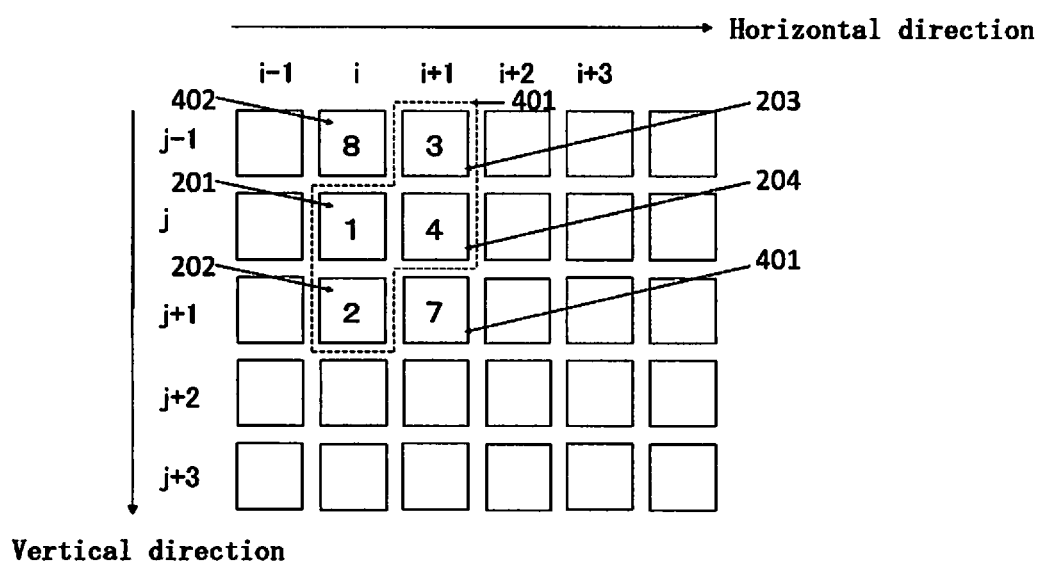
FIG. 4 is a diagram showing the arrangement of a shared pixel cell according to the present invention (when n is equal to −1).

FIG. 4 is a diagram showing the arrangement in a shared pixel cell according to the third means of the present invention, in a case where n is equal to −1, in which an eighth photodiode is disposed to the immediate left of the third photodiode, and a seventh photodiode is disposed to the immediate right of the second photodiode.

As in the timing chart shown in FIG. 6, the operation of deselecting the FD block is repeatedly performed every time a signal is read out from a photodiode.

The operations are performed as follows in the case where n is equal to +1. After a signal is read out from the first photodiode, a signal is read out from the fifth photodiode in the identical readout blanking period. A signal is read out from the third photodiode in a subsequent readout blanking period, and then a signal is read out from the second photodiode in the identical readout blanking period. A signal is read out from the sixth photodiode in a further subsequent readout blanking period, and then a signal is read out from the fourth photodiode in the identical readout blanking period.

In the case where n is equal to −1, after a signal is read out from the eighth photodiode, a signal is read out from the third photodiode in the identical readout blanking period. A signal is read out from the fourth photodiode in a subsequent readout blanking period, and then a signal is read out from the first photodiode in the identical readout blanking period. A signal is read out from the second photodiode in a further subsequent readout blanking period, and then a signal is read out from the seventh photodiode in the identical readout blanking period.

In these readout operations, the outputs of the CMOS image sensor are read out in the horizontal direction for each row. Accordingly, signals can be outputted in the raster scanning method that has compatibility with a conventional CMOS image sensor. Therefore, it is possible to replace the conventional CMOS image sensor with a CMOS image sensor of high performance with no change being made to the peripheral circuits.

INDUSTRIAL APPLICABILITY

The solid-state image sensor, the manufacturing method therefor, and the solid-state image pickup device according to the present invention are applied to CMOS image sensors, electronic cameras, and the like, and contribute to reduction in size, increase in the number of pixels, and prevention of deterioration of the imaging properties such as decrease in saturation signal amount and deterioration in sensibility. Moreover, the solid-state image pickup device according to the present invention may be widely utilized in cameras or camera systems for digital still cameras, mobile cameras, cameras for medical use, vehicle cameras, video cameras, monitoring cameras, security cameras, and the like, which concern high image quality.

The invention claimed is:

1. A solid-state image pickup device comprising on a semiconductor substrate:
   a pixel array including a plurality of photodiodes that are disposed in a matrix (i, j) to convert light beams into signal charges and accumulate the signal charges;
   readout circuits provided above and below the pixel array;
   electric charge transfer gates each for reading out the signal charges accumulated in the corresponding photodiode;
   a floating diffusion for converting into electric potentials the signal charges that are photoelectrically converted by the photodiodes and are read out through the electric charge transfer gates;
   a reset transistor for resetting the signal charges; and
   an amplifier transistor for amplifying the read out signal charges,
   the reset transistor and the amplifier transistor being shared by the four adjacent photodiodes, and
   the photodiodes including a first photodiode (i, j), a second photodiode (i, j+1), a third photodiode (i+1, j+n), and a fourth photodiode (i+n, j+n+1) being disposed respectively, in which n is equal to −1 or +1, wherein
   the signal charges are read out from the first and third photodiodes by one of the readout circuits above and below the pixel array, and the signal charges are read out from the second and fourth photodiodes by the readout circuit that is not used to read out the signal charges from the first and third photodiodes.

2. The solid-state image pickup device according to claim 1, wherein
   signals are read out from two of the first to fourth photodiodes in an identical readout blanking period, the two photodiodes of which the signals are read out in the identical blanking period are the first and second photodiodes, and the remaining two photodiodes of which the signals are read out in a subsequent blanking period are the third and fourth photodiodes.

3. A solid-state image pickup device comprising on a semiconductor substrate:
   a pixel array including a plurality of photodiodes that are disposed in a matrix (i, j) to convert light beams into signal charges and accumulate the signal charges;
   readout circuits provided above and below the pixel array;

electric charge transfer gates each for reading out the signal charges accumulated in the corresponding photodiode;

a floating diffusion for converting into electric potentials the signal charges that are photoelectrically converted by the photodiodes and are read out through the electric charge transfer gates;

a reset transistor for resetting the signal charges; and an amplifier transistor for amplifying the read out signal charges, the reset transistor and the amplifier transistor being shared by the four adjacent photodiodes, and the photodiodes including a first photodiode (i, j), a second photodiode (i, j+1), a third photodiode (i+1, j+n), and a fourth photodiode (i+n, j+n+1) being disposed respectively, in which n is equal to −1 or +1, wherein when n is equal to +1, the photodiodes include a fifth photodiode (i+1, j) adjacent to the first photodiode and a sixth photodiode (i, j+2) adjacent to the fourth photodiode, and the signal charges are read out from a combination of the first and fifth photodiodes or a combination of the fourth and sixth photodiodes in an identical readout blanking period.

4. A solid-state image pickup device comprising on a semiconductor substrate:

a pixel array including a plurality of photodiodes that are disposed in a matrix (i, j) to convert light beams into signal charges and accumulate the signal charges;

readout circuits provided above and below the pixel array;

electric charge transfer gates each for reading out the signal charges accumulated in the corresponding photodiode;

a floating diffusion for converting into electric potentials the signal charges that are photoelectrically converted by the photodiodes and are read out through the electric charge transfer gates;

a reset transistor for resetting the signal charges; and an amplifier transistor for amplifying the read out signal charges, the reset transistor and the amplifier transistor being shared by the four adjacent photodiodes, and the photodiodes including a first photodiode (i, j), a second photodiode (i, j+1), a third photodiode (i+1, j+n), and a fourth photodiode (i+n, j+n+1) being disposed respectively, in which n is equal to −1 or +1, wherein when n is equal to −1, the photodiodes include a seventh photodiode (i+1, j+1) adjacent to the second photodiode and an eighth photodiode (i, j−1) adjacent to the third photodiode, and the signal charges are read out from a combination of the second and seventh photodiodes or a combination of the eighth and third photodiodes in an identical readout blanking period.

5. The solid-state image pickup device according to claim 3, wherein when the signal charges are sequentially read out from one of the first to fourth photodiodes and one of the fifth to eighth photodiodes in an identical readout blanking period, between an operation of firstly reading out the signal charge from the corresponding photodiode and an operation of secondly reading out the signal charge from the corresponding photodiode, the floating diffusion shared by the photodiode subjected to the first readout operation and the photodiode subjected to the second readout operation is changed from a selected state to a deselected state.

6. The solid-state image pickup device according to claim 4, wherein when the signal charges are sequentially read out from one of the first to fourth photodiodes and one of the fifth to eighth photodiodes in an identical readout blanking period, between an operation of firstly reading out the signal charge from the corresponding photodiode and an operation of secondly reading out the signal charge from the corresponding photodiode, the floating diffusion shared by the photodiode subjected to the first readout operation and the photodiode subjected to the second readout operation is changed from a selected state to a deselected state.

* * * * *